United States Patent
Goodwin

(10) Patent No.: US 9,291,918 B2
(45) Date of Patent: Mar. 22, 2016

(54) LIGHT SOURCE ASSEMBLY THAT GENERATES HETERODYNE OUTPUT BEAMS

(75) Inventor: Eric Peter Goodwin, Tucson, AZ (US)

(73) Assignee: NIKON CORPORATION (JP)

( * ) Notice: Subject to any disclaimer, the term of this patent is extended or adjusted under 35 U.S.C. 154(b) by 573 days.

(21) Appl. No.: 13/407,565

(22) Filed: Feb. 28, 2012

(65) Prior Publication Data
US 2012/0229817 A1 Sep. 13, 2012

Related U.S. Application Data

(60) Provisional application No. 61/450,272, filed on Mar. 8, 2011.

(51) Int. Cl.
*G01B 11/03* (2006.01)
*G03F 7/20* (2006.01)
*G02F 1/11* (2006.01)
*G01B 9/02* (2006.01)

(52) U.S. Cl.
CPC .............. *G03F 7/70775* (2013.01); *G02F 1/11* (2013.01); *G01B 9/02007* (2013.01); *G01B 11/03* (2013.01); *G02F 2201/16* (2013.01)

(58) Field of Classification Search
CPC .................................................. G01B 9/02007
USPC ...................... 356/237.1–241.6, 242.1–243.8, 356/426–431, 600–640
See application file for complete search history.

(56) References Cited

U.S. PATENT DOCUMENTS

| | | | | |
|---|---|---|---|---|
| 3,930,732 A | * | 1/1976 | Holly | G01M 11/0292 250/208.2 |
| 4,466,738 A | * | 8/1984 | Huang | G01D 5/26 326/28.5 |
| 4,688,940 A | * | 8/1987 | Sommargren | G01J 9/04 356/487 |
| 4,697,888 A | * | 10/1987 | Schmadel, Jr. | H01S 3/08004 359/307 |
| 4,735,476 A | * | 4/1988 | Heffner | G02F 1/335 385/123 |
| 5,026,162 A | * | 6/1991 | Langdon | G01S 3/782 356/485 |
| 5,369,489 A | * | 11/1994 | Somekh | 356/489 |

OTHER PUBLICATIONS

Zygo, A Primer on Displacement Measuring Interferometers, Revised 1/99, 91 pages, OEM Better Technology. Better Metrology ™.
Opto-Electronic brochure, "Do you know Acousto-optics?", pp. 1-20, available to public at least as early as Dec. 9, 2005.
Li et al., "Optical phase shifting with acousto-optic devices", Optics Letters, vol. 30, No. 2, pp. 189-191, Jan. 15, 2005.

* cited by examiner

*Primary Examiner* — Gregory J Toatley
*Assistant Examiner* — Jarreas C. Underwood
(74) *Attorney, Agent, or Firm* — Roeder & Broder LLP; Steven G. Roeder

(57) ABSTRACT

A beam adjuster assembly (14) receives an input beam (16) and provides a first output beam (18) and a spaced apart second output beam (20). The beam adjuster assembly (14) comprises a first frequency adjuster (22) and a second frequency adjuster (24). The first frequency adjuster (22) receives the input beam (16). The first frequency adjuster (22) transmits a first portion of the input beam (16) to provide the first output beam (18) having a first output frequency. Additionally, the first frequency adjuster (22) adjusts a second portion of the input beam (16) to provide a first adjusted beam (354). The second frequency adjuster (24) receives the first adjusted beam (354). Moreover, the second frequency adjuster (24) adjusts at least a portion of the first adjusted beam (354) to provide the second output beam (20) having a second output frequency that is different than the first output frequency.

35 Claims, 6 Drawing Sheets

LIGHT SOURCE ASSEMBLY THAT GENERATES HETERODYNE OUTPUT BEAMS

RELATED APPLICATION

The application claims priority on Provisional Application Ser. No. 61/450,272 filed on Mar. 8, 2011, entitled "High Efficiency Method for Generating Heterodyne Light Source Beams". As far as is permitted, the contents of U.S. Provisional Application Ser. No. 61/450,272 are incorporated herein by reference.

BACKGROUND

Lithography systems are commonly used to transfer images from a reticle onto a semiconductor wafer during semiconductor processing. A typical lithography system includes an illumination source, a reticle stage assembly that positions a reticle, an optical assembly, a wafer stage assembly that positions a semiconductor wafer, a measurement system, and a control system. The measurement system constantly monitors the position of the reticle and the wafer, and the control system controls each stage assembly to constantly adjust the position of the reticle and the wafer. The features of the images transferred from the reticle onto the wafer are extremely small. Accordingly, the precise positioning of the wafer and the reticle is critical to the manufacturing of high quality wafers.

A typical measurement system includes one or more interferometers and/or one or more encoders. Certain types of interferometers and encoders utilize a light source that provides a pair of light beams that have a fixed frequency difference. Unfortunately, existing light sources have suffered from inefficiency, low power output, high costs and/or difficulty in fully separating the light beams. Accordingly, a system or assembly is desired which can avoid such drawbacks.

SUMMARY

The present invention is directed to a beam adjuster assembly that receives an input beam and provides a first output beam and a spaced apart second output beam. In certain embodiments, the beam adjuster assembly comprises a first frequency adjuster and a second frequency adjuster. The first frequency adjuster receives the input beam. The first frequency adjuster transmits a first portion of the input beam to provide the first output beam having a first output frequency. Additionally, the first frequency adjuster adjusts a second portion of the input beam to provide a first adjusted beam. The second frequency adjuster receives the first adjusted beam. Moreover, the second frequency adjuster adjusts at least a portion of the first adjusted beam to provide the second output beam having a second output frequency that is different than the first output frequency.

In one embodiment, the first output beam has a first power and the second output beam has a second power that is substantially equal to the first power.

Additionally, in some embodiments, the second output frequency is different than the first output frequency by between approximately 10 MHz and 30 MHz. In one such embodiment, the second output frequency is different than the first output frequency by approximately 20 MHz.

In some embodiments, at least one of the first frequency adjuster and the second frequency adjuster is an acousto-optic frequency modulator. Further, in one embodiment, each of the first frequency adjuster and the second frequency adjuster is an acousto-optic frequency modulator.

Further, in certain embodiments, the first adjusted beam has a first adjusted frequency that is different than the first output frequency by between approximately 60 and 250 MHz. Moreover, in such embodiments, the second output frequency can be different than the first adjusted frequency by between approximately 60 and 250 MHz.

In certain embodiments, the first frequency adjuster shifts an input frequency of the input beam in a first shift direction to provide the first adjusted beam. Additionally, in such embodiments, the second frequency adjuster can shift the first adjusted frequency of the first adjusted beam in a second shift direction to provide the second output beam. In some such embodiments, the second shift direction is different from the first shift direction. For example, in one embodiment, the first shift direction includes one of an upshift and a downshift from the first input frequency to the first adjusted frequency, and the second shift direction includes the other of an upshift and a downshift from the first adjusted frequency to the second output frequency.

The present invention is further directed to a light source assembly comprising a beam source that provides an input beam, and the beam adjuster assembly as described above that receives the input beam and provides the first output beam and the spaced apart second output beam.

Additionally, the present invention is directed to a measurement system for measuring the displacement of a stage assembly relative to a reference, the measurement system comprising: the light source assembly as described above, and a system head that receives the first output beam and the second output beam provided by the light source assembly, the system head directing at least one of the output beams at the stage assembly.

Further, the present invention is also directed to an exposure apparatus comprising a stage assembly that retains a device, and the measurement system as described above that measures the displacement of the stage assembly relative to the reference.

Moreover, the present invention is also directed to a method for providing a first output beam and a spaced apart second output beam, the method comprising the steps of: (i) receiving an input beam with a first frequency adjuster; (ii) transmitting a first portion of the input beam with the first frequency adjuster to provide the first output beam having a first output frequency; (iii) adjusting a second portion of the input beam with the first frequency adjuster to provide a first adjusted beam; (iv) receiving the first adjusted beam with a second frequency adjuster; and (v) adjusting at least a portion of the first adjusted beam with the second frequency adjuster to provide the second output beam having a second output frequency that is different than the first output frequency.

BRIEF DESCRIPTION OF THE DRAWINGS

The novel features of this invention, as well as the invention itself, both as to its structure and its operation, will be best understood from the accompanying drawings, taken in conjunction with the accompanying description, in which similar reference characters refer to similar parts, and in which.

DESCRIPTION

Figure 1:
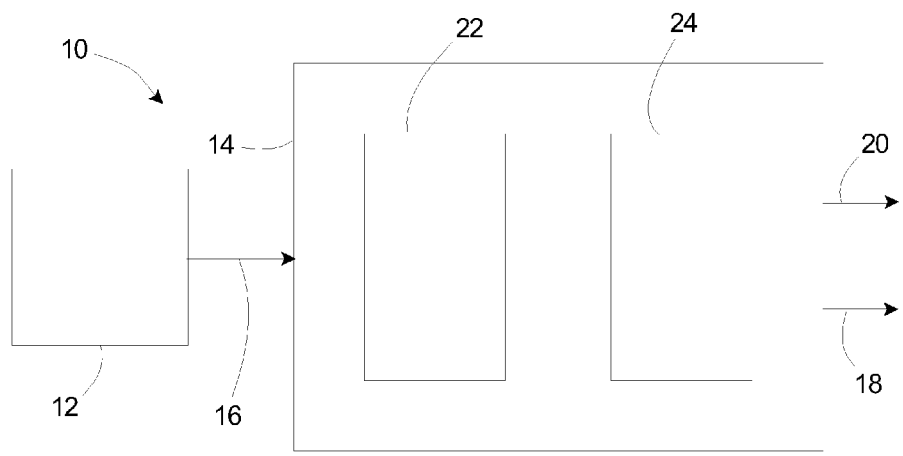
FIG. 1 is a simplified schematic illustration of a light source assembly including a beam source and an embodiment of a beam adjuster assembly having features of the present invention that provides a first output beam and a second output beam.

FIG. 1 is a simplified schematic illustration of a light source assembly 10 including a beam source 12, e.g., a laser, and an embodiment of a beam adjuster assembly 14 having features of the present invention. The beam source 12 generates an input light beam 16, e.g., a laser beam, (also referred to herein as an "input beam") and directs the input beam 16 toward the beam adjuster assembly 14. The input beam 16 has an input frequency and an input power that can be varied depending upon the specific requirements of the light source assembly 10. In certain embodiments, the input frequency can be between approximately 300 THz and 800 THz. More specifically, in some embodiments, the input frequency can be between approximately 470 and 480 THz. For example, in one embodiment, the input frequency can be approximately 474 THz. Alternatively, the input frequency can be less than 300 THz or greater than 800 THz. Additionally, in certain embodiments, the input power can be between approximately 1 mW and 200 mW. More specifically, in some embodiments, the input power can be between approximately 20 mW and 100 mW. For example, in one embodiment, the input power can be approximately 35 mW. Alternatively, the input power can be greater than 200 mW. A suitable laser to be used as the beam source 12 can be obtained from Research Electro-Optics, Inc. of Boulder, Colo.

As an overview, in certain embodiments, the beam adjuster assembly 14 is designed to receive the input beam 16 and to provide a first output beam 18 having a first output frequency and a spaced apart second output beam 20 having a second output frequency that is different than the first output frequency. In one embodiment, the first output frequency can be different than the second output frequency by a predetermined fixed frequency difference, e.g., 20 MHz. More specifically, in certain embodiments, the beam adjuster assembly 14 includes a first beam frequency adjuster 22 and a second beam frequency adjuster 24 (also referred to herein as a "first frequency adjuster" and a "second frequency adjuster") that are positioned in series in order to provide the desired first output beam 18 and the desired second output beam 20.

Additionally, as described in detail herein, the first frequency adjuster 22 adjusts the frequency of a first incident beam by a relatively large amount, and the second frequency adjuster 24 adjusts the frequency of a second incident beam by a relatively large amount that is different than the adjustment made by the first frequency adjuster 22. Further, each of the frequency adjusters 22, 24 can shift the frequency of the incident beam in opposing shift directions, i.e. one of the frequency adjusters 22, 24 can upshift the frequency of the incident beam and the other frequency adjuster 22, 24 can downshift the frequency of the incident beam. By making the relatively large frequency shifts in opposing shift directions with each of the frequency adjusters 22, 24, a great separation angle can be realized between the beams, which enables a more compact and efficient light source assembly 10. Further, the frequency adjusters 22, 24 can operate more efficiently with larger shifts, as larger shifts are more compatible with the high diffraction efficiency regime for the available materials.

Moreover, as will be described in greater detail below, in one embodiment, the first output beam 18 can have a first output power and the second output beam 20 can have a second output power that is substantially equal to the first output power. With this design, heterodyne light source beams can be provided with the fixed frequency difference, while inhibiting unwanted diffraction orders that lead to wasted light, which would otherwise result in inefficient, expensive and low power output performance of the system in which the beams are used.

It should be noted that the greater the input power of the input beam 16, the greater the output power can be for the output beams 18, 20, both individually and in combination.

Additionally, having the first output beam 18 spaced apart from the second output beam 20, i.e. avoiding having collinear beams, obviates the need for using a polarizing beam splitter, which use can lead to an unacceptable amount of polarization leakage and an inefficient system output. This undesired polarization leakage can lead to position measurement errors in the final overall system.

Further, in certain embodiments, the beam adjuster assembly 14 receives the single input beam 16 from a single beam source 12 and provides the first output beam 18 and the second output beam 20 which are spaced apart from each other and substantially parallel to each other.

Figure 2A:
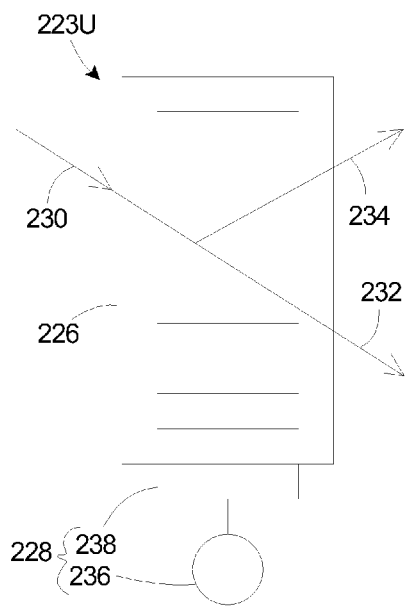
FIG. 2A is a simplified schematic illustration of an upshift frequency adjuster that is usable as part of the beam adjuster assembly illustrated in FIG. 1.

FIG. 2A is a simplified schematic illustration of an upshift frequency adjuster 223U that is usable as part of the beam adjuster assembly 14 illustrated in FIG. 1. In particular, the upshift frequency adjuster 223U illustrated in FIG. 2A upshifts the frequency of an incident beam 230. In different embodiments, the upshift frequency adjuster 223U can function as the first frequency adjuster 22 (illustrated in FIG. 1) and/or the second frequency adjuster 24 (illustrated in FIG. 1).

The design of the upshift frequency adjuster 223U can be varied depending upon the needs of the beam adjuster assembly 14 and/or the light source assembly 10 (illustrated in FIG. 1). In certain embodiments, as illustrated herein, the upshift frequency adjuster 223U can comprise an acousto-optic frequency modulator (AOFM). Alternatively, the upshift frequency adjuster 223U can have a different design.

During use, in certain embodiments, an AOFM can achieve a transmission efficiency (TE) of approximately ninety-five percent. Stated another way, when a source beam is received and modulated by an AOFM, the output beam or beams have a total power output that is approximately ninety-five percent of the power of the source beam, with the remaining five percent of the power of the source beam being either absorbed by the acousto-optic material or reflected at the interfaces between air and the acousto-optic material.

Additionally, during use, in certain embodiments, an AOFM can have a diffraction efficiency (DE) that is selectively tunable between zero percent and seventy-five percent, which is readily achievable with currently available AOFMs. Stated another way, when a source beam is received and modulated by an AOFM, the AOFM can be selectively tuned such that between zero percent and seventy-five percent of the source beam is diffracted, i.e. experiences a frequency shift, and the remaining percentage of the source beam is transmitted by the AOFM without any diffraction or frequency shift. Alternatively, during use, an AOFM can have a diffraction efficiency that is selectively tunable to as high as ninety or ninety-five percent.

In the embodiment illustrated in FIG. 2A, the upshift frequency adjuster 223U is an AOFM that includes an adjuster body 226 and a sound wave source assembly 228 that provides sound waves to the adjuster body 226.

Figure 3:
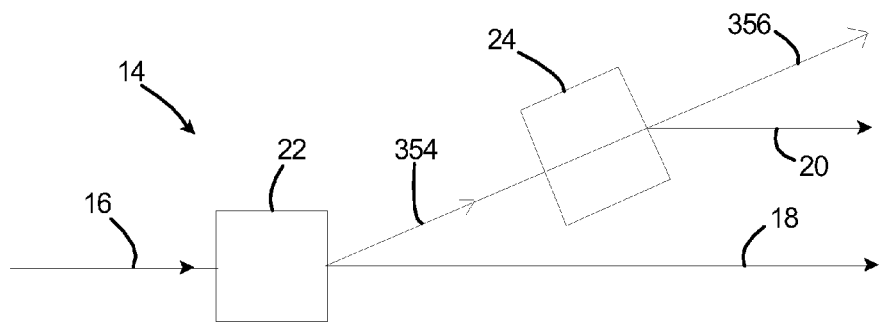
FIG. 3 is a simplified schematic illustration demonstrating one example of the operation of the beam adjuster assembly illustrated in FIG. 1.

During use, the adjuster body 226 receives the incident beam 230, e.g., the input beam 16 (illustrated in FIG. 3) or the first adjusted beam 354 (illustrated in FIG. 3). Additionally, the sound waves that are provided to the adjuster body 226 diffract a portion of the incident beam 230, such that (i) a first portion of the incident beam 230 is transmitted directly through the adjuster body 226 without any change in frequency, i.e. a transmitted beam 232 is produced that has a frequency that is equal to the frequency of the incident beam 230; and (ii) a second portion of the incident beam 230 is adjusted or shifted to produce an adjusted beam 234 that has a frequency that is different than the frequency of the incident beam 230 and the transmitted beam 232. As shown in FIG. 2A, in this embodiment, the frequency of the adjusted beam 234 has been "upshifted" such that the frequency of the adjusted beam 234 is greater than the frequency of the incident beam 230 and the transmitted beam 232.

It should be noted that the frequency shift between the incident beam 230 and the adjusted beam 234 also results in a corresponding angular separation between the transmitted beam 232 (having no frequency shift) and the adjusted beam 234. More specifically, the greater the frequency shift between the incident beam 230 and the adjusted beam 234, the greater the angular separation between the transmitted beam 232 and the adjusted beam 234.

In certain embodiments, the adjuster body 226 can be made from fused silica, lithium niobate, arsenic trisulfide, tellurium dioxide, tellurite glasses, lead silicate, mercury chloride, lead bromide, or other suitable materials.

As provided above, the sound wave source assembly 228 provides sound waves to the adjuster body 226 that act on the incident beam 230 to effectuate the resulting shifting or adjustment of the frequency of a portion of the incident beam 230. The design of the sound wave source assembly 228 can be varied. In the embodiment illustrated in FIG. 2A, the sound wave source assembly 228 includes an energy source 236 and an energy converter 238.

The energy source 236 provides energy, e.g., electrical energy, to the energy converter 238. Subsequently, the energy converter 238 converts the energy into sound waves which are then directed into the adjuster body 226. In one embodiment, the energy converter 238 can be an ultrasonic transducer. Alternatively, the energy converter 238 can have a different design.

Figure 2B:
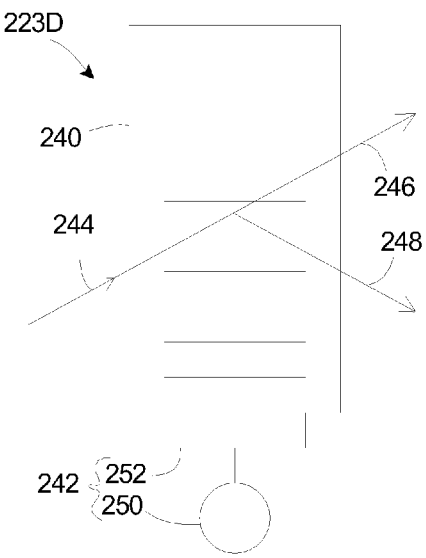
FIG. 2B is a simplified schematic illustration of a downshift frequency adjuster that is usable as part of the beam adjuster assembly illustrated in FIG. 1.

FIG. 2B is a simplified schematic illustration of a downshift frequency adjuster 223D that is usable as part of the beam adjuster assembly 14 illustrated in FIG. 1. In particular, the downshift frequency adjuster 223D illustrated in FIG. 2B downshifts the frequency of an incident beam 244. In different embodiments, the downshift frequency adjuster 223D can function as the first frequency adjuster 22 (illustrated in FIG. 1) and/or the second frequency adjuster 24 (illustrated in FIG. 1).

The design of the downshift frequency adjuster 223D can be varied depending upon the needs of the beam adjuster assembly 14 and/or the light source assembly 10 (illustrated in FIG. 1). In certain embodiments, as illustrated herein, the downshift frequency adjuster 223D can comprise an acousto-optic frequency modulator (AOFM). Moreover, as illustrated, the downshift frequency adjuster 223D can have a design that is substantially similar to the design of the upshift frequency adjuster 223U (illustrated in FIG. 2A). Alternatively, the downshift frequency adjuster 223D can have a different design.

In the embodiment illustrated in FIG. 2B, the downshift frequency adjuster 223D is an AOFM that includes an adjuster body 240 and a sound wave source assembly 242 that provides sound waves to the adjuster body 240.

During use, the adjuster body 240 receives the incident beam 244, e.g., the input beam 16 (illustrated in FIG. 3) or the first adjusted beam 354 (illustrated in FIG. 3). Additionally, the sound waves that are provided to the adjuster body 240 diffract a portion of the incident beam 244, such that (i) a first portion of the incident beam 244 is transmitted directly through the adjuster body 240 without any change in frequency, i.e. a transmitted beam 246 is produced that has a frequency that is equal to the frequency of the incident beam 244; and (ii) a second portion of the incident beam 244 is adjusted or shifted to produce an adjusted beam 248 that has a frequency that is different than the frequency of the incident beam 244 and the transmitted beam 246. As shown in FIG. 2B, in this embodiment, the frequency of the adjusted beam 248 has been "downshifted" such that the frequency of the adjusted beam 248 is less than the frequency of the incident beam 244 and the transmitted beam 246.

In certain embodiments, the adjuster body 240 can be made from fused silica, lithium niobate, arsenic trisulfide, tellurium dioxide, tellurite glasses, lead silicate, mercury chloride, lead bromide, or other suitable materials.

As provided above, the sound wave source assembly 242 provides sound waves to the adjuster body 240 that act on the incident beam 244 to effectuate the resulting shifting or adjustment of the frequency of a portion of the incident beam 244. The design of the sound wave source assembly 242 can be varied. In the embodiment illustrated in FIG. 2B, the sound wave source assembly 242 includes an energy source 250 and an energy converter 252.

The energy source 250 provides energy, e.g., electrical energy, to the energy converter 252. Subsequently, the energy converter 252 converts the energy into sound waves which are then directed into the adjuster body 240. In one embodiment, the energy converter 252 can be an ultrasonic transducer. Alternatively, the energy converter 252 can have a different design.

FIG. 3 is a simplified schematic illustration demonstrating one example of the operation of the beam adjuster assembly 14 illustrated in FIG. 1. As noted above, the beam adjuster assembly 14 includes the first frequency adjuster 22 and the second frequency adjuster 24 that are positioned in series. Additionally, as noted above, the beam adjuster assembly 14 receives the input beam 16 and produces the first output beam 18 and the second output beam 20. Moreover, as provided above, the first output beam 18 and the second output beam 20 are spaced apart from one another.

Initially, the input beam 16 is directed from the beam source 12 (illustrated in FIG. 1) toward the first frequency adjuster 22 of the beam adjuster assembly 14. As provided above, the input beam 16 has an input frequency and has an input power that can be varied as necessary depending on the requirements of the beam adjuster assembly 14 and/or the light source assembly 10 (illustrated in FIG. 1).

As illustrated, the first frequency adjuster 22 is positioned in the path of the input beam 16 and receives the input beam 16. The first frequency adjuster 22 transmits a first portion of the input beam 16 to provide the first output beam 18, and the first frequency adjuster 22 adjusts a second portion of the input beam 16 to provide a first adjusted beam 354. Because the first output beam 18 is merely transmitted by the first frequency adjuster 22, the first output beam 22 will have a first output frequency that is substantially equal to the input frequency. Conversely, because the first adjusted beam 354 is produced by adjusting, shifting and/or diffracting the input beam 16, the first adjusted beam 354 will have a first adjusted frequency that is different than the input frequency and the first output frequency. In certain embodiments, the first adjusted frequency can be different than the input frequency and the first output frequency by between approximately 60 and 250 MHz. For example, in one specific embodiment, the first adjusted frequency can be different than the input frequency and the first output frequency by approximately 100 MHz. Alternatively, the first adjusted frequency can be different than the input frequency and the first output frequency by less than 60 MHz or more than 250 MHz. Moreover, the first frequency adjuster 22 can be designed so that the first adjusted frequency has been "upshifted", i.e. where the first adjusted frequency is greater than the input frequency and the first output frequency, and where the first adjusted beam 354 is angled in an upward direction relative to the first output beam 18. Alternatively, the first frequency adjuster 22 can be designed so that the first adjusted frequency has been "downshifted", i.e. where the first adjusted frequency is less than the input frequency and the first output frequency, and where the first adjusted beam 354 is angled in a downward direction relative to the first output beam 18.

It should be noted that a low frequency adjustment, e.g., approximately 10 MHz to 30 MHz of the second portion of the input beam by the first frequency adjuster 22 to provide the first adjusted beam 354, results in operation in the Raman-Nath regime, with unwanted diffraction orders leading to wasted light and lower overall power output. Conversely, by providing at least 60 MHz difference between the input frequency of the input beam 16 and the first adjusted frequency of the first adjusted beam 354, the light source assembly 10 operates in the Bragg regime, which inhibits the generation of wasted light and improves the overall power output.

Additionally, as noted above, the first frequency adjuster 22 is selectively tunable such that a diffraction efficiency of the first frequency adjuster 22 can be set at any value from zero percent to seventy-five percent. Stated another way, the first frequency adjuster 22 can be selectively tuned so that between zero percent and seventy-five percent of the input beam 16 can be adjusted, i.e. shifted and/or diffracted, to produce the first adjusted beam 354. As will be described in greater detail below, in certain embodiments, the diffraction efficiency of the first frequency adjuster 22 is tuned such that a first power of the first output beam 18 is substantially equal to a second power of the second output beam 20.

Further, as illustrated, the second frequency adjuster 24 is positioned in the path of the first adjusted beam 354 and receives the first adjusted beam 354. The second frequency adjuster 24 transmits a first portion of the first adjusted beam 354 to provide a wasted beam 356, i.e. a beam of light that is not used by the light source assembly 10; and the second frequency adjuster 24 adjusts a second portion of the first adjusted beam 354 to provide the second output beam 20. Because the second output beam 20 is produced by adjusting, shifting and/or diffracting the first adjusted beam 354, the second output beam 20 will have a second output frequency that is different than the first adjusted frequency. In certain embodiments, the second output frequency can be different than the first adjusted frequency by between approximately 60 and 250 MHz. For example, in one specific embodiment, the second output frequency can be different than the first adjusted frequency by approximately 80 MHz. Alternatively, the second output frequency can be different than the first adjusted frequency by less than 60 MHz or more than 250 MHz. Moreover, the second frequency adjuster 24 can be designed so that the second output frequency has been "downshifted", i.e. where the second output frequency is less than the first adjusted frequency, and where the second output beam 20 is angled in a downward direction relative to the first adjusted beam 354. Alternatively, the second frequency adjuster 24 can be designed so that the second output frequency has been "upshifted", i.e. where the second output frequency is greater than the first adjusted frequency, and where the second output beam 20 is angled in an upward direction relative to the first adjusted beam 354.

It should be noted that since the overall desire is to have the first output frequency and the second output frequency be relatively close together, in embodiments in which the first frequency adjuster 22 upshifts the input beam 16, the second frequency adjuster 24 will generally be designed to downshift the first adjusted beam 354 so as to provide a narrower frequency difference between the first output beam 18 and the second output beam 20. Somewhat similarly, in embodiments in which the first frequency adjuster 22 downshifts the input beam 16, the second frequency adjuster 24 will generally be designed to upshift the first adjusted beam 354 so as to provide a narrower frequency difference between the first output beam 18 and the second output beam 20. For example, in certain embodiments, the first frequency adjuster 22 and the second frequency adjuster 24 will be designed so that the first output frequency of the first output beam 18 is different than the second output frequency of the second output beam 20 by between approximately 10 and 30 MHz. Stated another way, the first frequency adjuster 22 and the second frequency adjuster 24 can cooperate to achieve a predetermined fixed frequency difference of between approximately 10 and 30 MHz. More particularly, in one embodiment, the first frequency adjuster 22 and the second frequency adjuster 24 are designed so that the first output frequency of the first output beam 18 is different than the second output frequency of the second output beam 20 by approximately 20 MHz, i.e. the predetermined fixed frequency difference can be approximately 20 MHz. Alternatively, the first frequency adjuster 22 and the second frequency adjuster 24 can be designed so that the first output frequency of the first output beam 18 is different than the second output frequency of the second output beam 20 by less than 10 MHz or greater than 30 MHz.

Additionally, as noted above, the second frequency adjuster 24 is selectively tunable such that a diffraction efficiency of the second frequency adjuster 24 can be set at any value from zero percent to seventy-five percent. Stated another way, the second frequency adjuster 24 can be selectively tuned so that between zero percent and seventy-five percent of the first adjusted beam 354 can be adjusted, i.e. shifted and/or diffracted, to produce the second output beam 20. In certain embodiments, because the desire is to have the first power of the first output beam 18 be substantially equal to the second power of the second output beam 20, while maximizing the overall power output of each output beam 18, 20, the diffraction efficiency of the second frequency adjuster 24 is tuned so that the diffraction efficiency of the second frequency adjuster 24 is maximized at approximately seventy-five percent.

With the serial arrangement of the first frequency adjuster 22 and the second frequency adjuster 24, the first frequency adjuster 22 receives the input beam 16 to produce the first output beam 18 and the first adjusted beam 354, and, subsequently, the second frequency adjuster 24 receives the first adjusted beam 354 to produce the second output beam 20.

It should be noted that, as opposed to a single AOFM that can be used to generate two light beams with a fixed frequency difference, e.g., 20 MHz, because the frequency difference in the present invention between the first adjusted frequency and the first output frequency is much greater than the overall desired frequency difference, the angular separation between the first adjusted beam 354 and the first output beam 18 is also much greater. Somewhat similarly, because the frequency difference in the present invention between the frequency of the wasted beam 356 and the second output frequency is much greater than the overall desired frequency difference, the angular separation between the wasted beam 354 and the second output beam 20 is also much greater. With this design, a more efficient light source assembly 10 can be achieved, which may otherwise be negatively impacted by a small angular separation between the beams.

Additionally, since the higher frequency shift is likely closer to the ideal conditions for the substance used for the frequency adjusters 22, 24, e.g., tellurium dioxide, the maximum diffraction efficiency is higher thereby inhibiting unwanted diffraction orders and minimizing the amount of wasted light.

Figure 4:
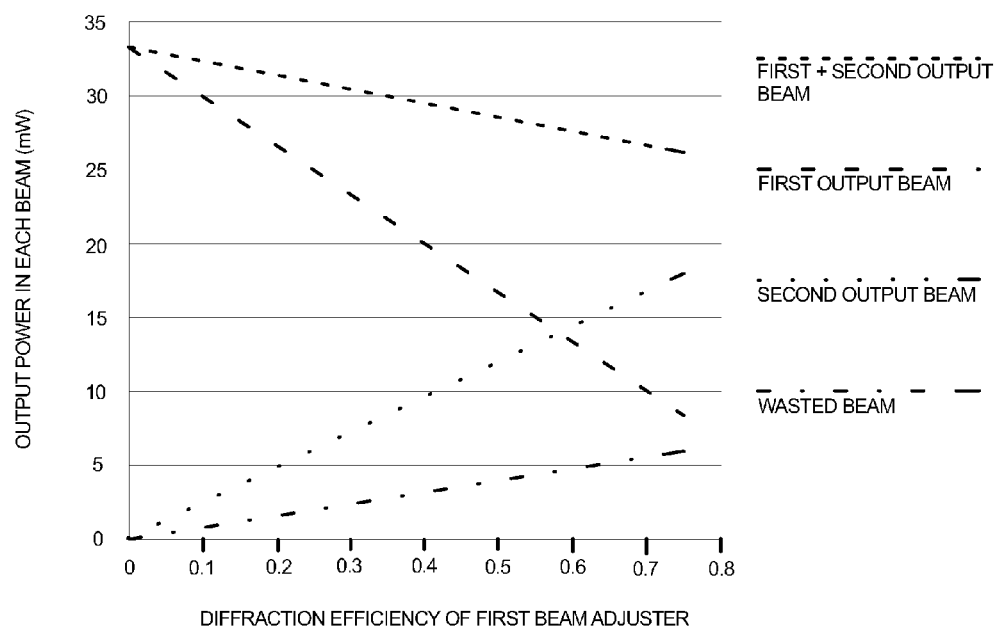
FIG. 4 is a graphical representation of power output versus diffraction efficiency for beams illustrated in FIG. 3.

FIG. 4 is a graphical representation of power output versus diffraction efficiency for the first output beam, the second output beam, the combined output beams, and the wasted beam. Initially, this graphical representation assumes that the diffraction efficiency of the second frequency adjuster is set at its maximum diffraction efficiency of seventy-five percent, and the input power of the input beam is 35 mW. Additionally, all calculations are made based on a transmission efficiency for each of the frequency adjusters of ninety-five percent.

As illustrated, the power output for the first output beam decreases as the diffraction efficiency of the first frequency adjuster increases, and the power output for the second output beam increases as the diffraction efficiency of the first frequency adjuster increases.

Equation (1) is provided to calculate the diffraction efficiency of the first frequency adjuster where the first power of the first output beam is equal to the second power of the second output beam. Specifically, $$IP \times TE_1 \times (1-DE_1) = IP \times TE_1 \times DE_1 \times TE_2 \times DE_2 \quad \text{(Equation 1)}$$

where IP is the input power of the input beam, $TE_1$ is the transmission efficiency of the first frequency adjuster, $DE_1$ is the diffraction efficiency of the first frequency adjuster, $TE_2$ is the transmission efficiency of the second frequency adjuster, and $DE_2$ is the diffraction efficiency of the second frequency adjuster. Based on the above-noted assumptions, i.e. setting $TE_1=0.95$, $TE_2=0.95$, and $DE_2=0.75$, the equation simplifies to:

$$(0.95) \times (1-DE_1) = (0.95) \times DE_1 \times (0.95) \times (0.75) \quad \text{(Equation 2)}$$

Solving for $DE_1$, it is determined that the diffraction efficiency of the first frequency adjuster where the first power of the first output beam is equal to the second power of the second output beam is approximately 58.4 percent. With the diffraction efficiency of the first frequency adjuster set to approximately 58.4 percent, and with an input power of 35 mW, the first power of the first output beam and the second power of the second output beam are each approximately 13.83 mW.

Figure 5:
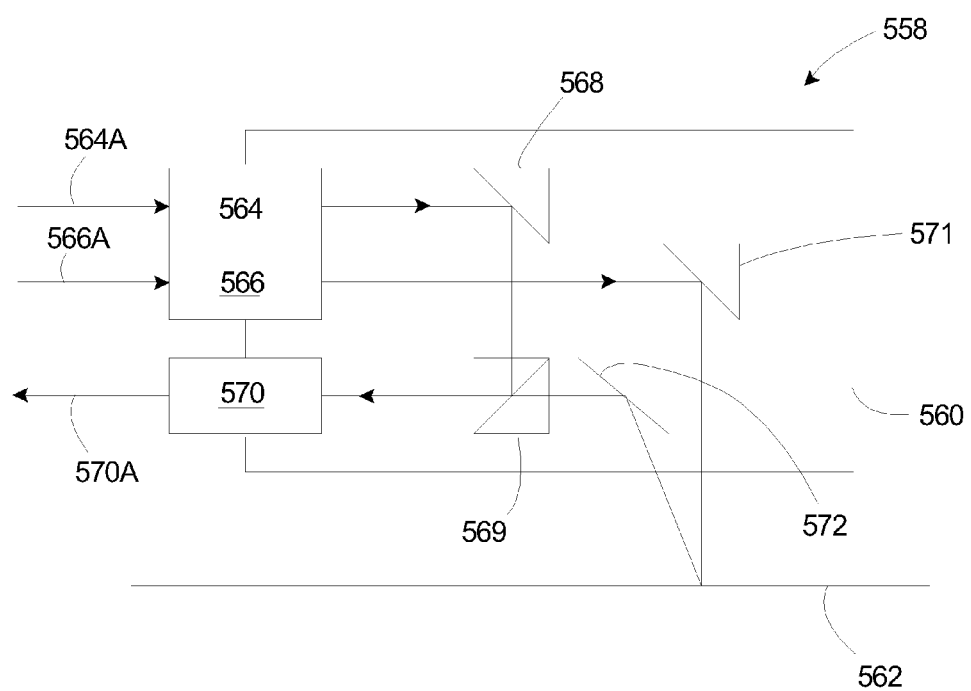
FIG. 5 is a simplified schematic illustration of a measurement system that utilizes the first output beam and the second output beam provided by the beam adjuster assembly.

FIG. 5 is a simplified schematic illustration of a measurement system 558, e.g., an encoder system, that utilizes the first output beam 18 (illustrated in FIG. 1) and the second output beam 20 (illustrated in FIG. 1) provided from the beam adjuster assembly 14 (illustrated in FIG. 1) to measure the displacement of a device, e.g., a reticle 690 (illustrated in FIG. 6) or a semiconductor wafer 692 (illustrated in FIG. 6), relative to a fixed reference. The design of the measurement system 558 can be varied. In the embodiment illustrated in FIG. 5, the measurement system 558 includes a fixed system head 560, e.g., an encoder head, and a system detector 562, e.g., an encoder grating plate, that is secured to a stage assembly, e.g., the stage of a reticle stage assembly 682 (illustrated in FIG. 6) or a wafer stage assembly 684 (illustrated in FIG. 6) that retains a device, e.g., a reticle 690 (illustrated in FIG. 6) or a wafer 692 (illustrated in FIG. 6). The system head 560 is fixed to a reference (not illustrated) that remains stationary during use.

As illustrated, the system head 560 includes a reference beam receiver 564 for receiving a reference beam 564A, and a measurement beam receiver 566 for receiving a measurement beam 566A. In one embodiment, the reference beam 564A can be the first output beam 18 and the measurement beam 566A can be the second output beam 20. Alternatively, the reference beam 564A can be the second output beam 20 and the measurement beam 566A can be the first output beam 18.

In FIG. 5, the reference beam receiver 564 receives the reference beam 564A and directs the reference beam 564A toward a first reference beam redirector 568, which subsequently redirects the reference beam 564A toward a second reference beam redirector 569. The second reference beam redirector 569 subsequently redirects the reference beam 564A toward a system output generator 570. In this embodiment, each of the reference beam redirectors 568, 569 and the system output generator 570 are positioned within and/or are secured to the system head 560. Since the system head 560 is fixed in position, and the reference beam 564A is not directed outside the system head 560 prior to being directed to the system output generator 570, the reference beam 564A provides a constant signal within the encoder system 558.

Additionally, in FIG. 5, the measurement beam receiver 566 receives the measurement beam 566A and directs the measurement beam 566A toward a first measurement beam redirector 571, which subsequently redirects the measurement beam 566A toward the system detector 562. The measurement beam 566A is then reflected off the system detector 562 toward a second measurement beam redirector 572, which redirects the measurement beam 566A toward the system output generator 570. As noted above, the system detector 562 is secured to the stage assembly, e.g., the stage of the reticle stage assembly 682 or the wafer stage assembly 684, which may be moving during use of the stage assembly. Since the stage assembly (and the device), and thus the system detector 562 may be moving during use, the measurement beam 566A provides a variable signal within the measurement system 558.

The system output generator 570 generates a system output signal 570A, i.e. an optical interference signal, based on a comparison of the constant signal provided by the reference beam 564A and the variable signal provided by the measurement beam 566A. Depending on the desired use of the measurement system 558, the system output signal 570A can then be provided to a control system, e.g., a control system 688

(illustrated in FIG. 6) of an exposure apparatus 674 (illustrated in FIG. 6), to enable effective control of the movement of the stage assembly (and the device).

Because the signal provided by the measurement beam 566A varies based on movement of the system detector 562 (and, thus, the stage assembly and the device) relative to the system head 560, the system output signal 570A relates to such movement of the system detector 562 relative to the system head 560. Because, the system detector 562 is attached to the stage assembly and the system head 560 is attached to the reference, the system output signal 570A also relates to the movement of the stage assembly (and the device) relative to the reference.

During use, if the system detector 562 (and, thus, the stage assembly and the device) remain stationary, the frequency of the system output signal 570A will be the exact difference between the frequency of the reference beam 564A and the frequency of the measurement beam 566A. Conversely, when the system detector 562 (and, thus, the stage assembly and the device) move, the frequency of the system output signal 570A will be shifted up or down depending on the direction of motion of the encoder detector 562.

Although the present invention is described herein in relation to use as part of and/or in conjunction with an encoder system, the teaching of the present invention is not intended to be limited to such usage. For example, the present invention is equally usable as part of and/or in conjunction with an interferometer system, or another system that requires precise movement measurements.

Figure 6:
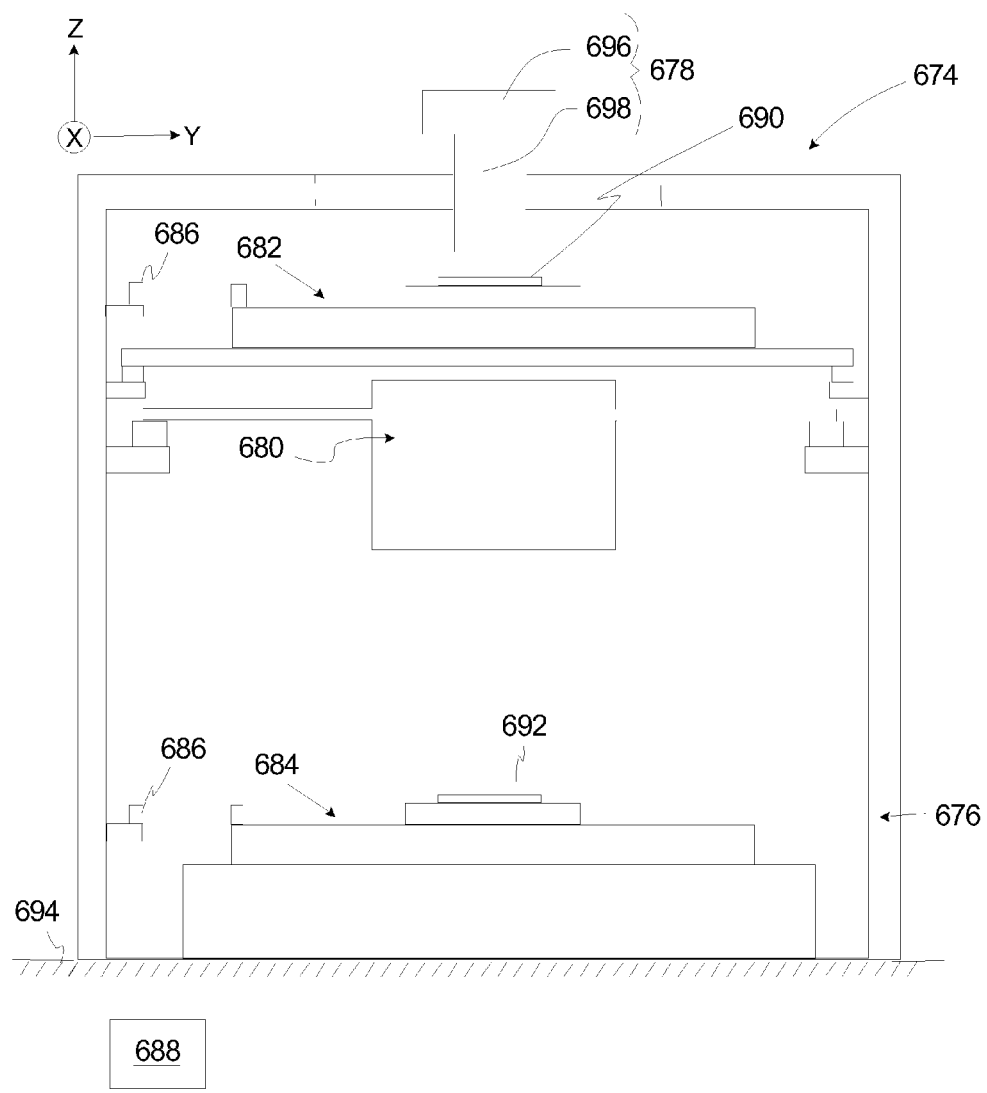
FIG. 6 is a schematic illustration of an exposure apparatus having features of the present invention.

FIG. 6 is a schematic illustration of a precision assembly, namely an exposure apparatus 674 (also referred to as a lithography system) useful with the present invention. The exposure apparatus 674 includes an apparatus frame 676, an illumination system 678 (irradiation apparatus), an optical assembly 680, a reticle stage assembly 682, a wafer stage assembly 684, a measurement system 686, and a control system 688. The design of the components of the exposure apparatus 674 can be varied to suit the design requirements of the exposure apparatus 674.

The exposure apparatus 674 is particularly useful as a lithographic device that transfers a pattern (not shown) of an integrated circuit from a reticle 690 onto a semiconductor wafer 692. The exposure apparatus 674 mounts to a mounting base 694, e.g., the ground, a base, or floor or some other supporting structure.

There are a number of different types of lithographic devices. For example, the exposure apparatus 674 can be used as scanning type photolithography system that exposes the pattern from the reticle 690 onto the wafer 692 with the reticle 690 and the wafer 692 moving synchronously. Alternatively, the exposure apparatus 674 can be a step-and-repeat type photolithography system that exposes the reticle 690 while the reticle 690 and the wafer 692 are stationary.

However, the use of the exposure apparatus 674 and the stage assemblies 682, 684 provided herein are not limited to a photolithography system for semiconductor manufacturing. The exposure apparatus 674, for example, can be used as an LCD photolithography system that exposes a liquid crystal display device pattern onto a rectangular glass plate or a photolithography system for manufacturing a thin film magnetic head. Further, the present invention can also be applied to a proximity photolithography system that exposes a mask pattern by closely locating a mask and a substrate without the use of a lens assembly. Additionally, the present invention provided herein can be used in other devices, including other semiconductor processing equipment, elevators, machine tools, metal cutting machines, inspection machines and disk drives.

The apparatus frame 676 is rigid and supports the components of the exposure apparatus 674. The apparatus frame 676 illustrated in FIG. 6 supports the reticle stage assembly 682, the optical assembly 680 and the illumination system 678 above the mounting base 694. The design of the apparatus frame 676 can be varied to suit the design requirements for the rest of the exposure apparatus 674.

The illumination system 678 includes an illumination source 696 and an illumination optical assembly 698. The illumination source 696 emits a beam (irradiation) of light energy. The illumination optical assembly 698 guides the beam of light energy from the illumination source 696 to the optical assembly 680. The beam illuminates selectively different portions of the reticle 690 and exposes the semiconductor wafer 692. In FIG. 6, the illumination source 696 is illustrated as being supported above the reticle stage assembly 682. Alternatively, the illumination source 696 can be secured to one of the sides of the apparatus frame 676 and the energy beam from the illumination source 696 is directed to above the reticle stage assembly 682 with the illumination optical assembly 698.

The optical assembly 680 projects and/or focuses the light passing through the reticle 690 to the wafer 692. Depending upon the design of the exposure apparatus 674, the optical assembly 680 can magnify or reduce the image illuminated on the reticle 690.

The reticle stage assembly 682 holds and positions the reticle 690 relative to the optical assembly 680 and the wafer 692. Similarly, the wafer stage assembly 684 holds and positions the wafer 692 with respect to the projected image of the illuminated portions of the reticle 690.

The measurement system 686 monitors movement of the reticle 690 and the wafer 692 relative to the optical assembly 680 or some other reference. With this information, the control system 688 can control the reticle stage assembly 682 to precisely position the reticle 690 and the wafer stage assembly 684 to precisely position the wafer 692. For example, the measurement system 686 can utilize one or more encoder systems, one or more laser interferometers, and/or other measuring devices.

The control system 688 is connected to the reticle stage assembly 682, the wafer stage assembly 684, and the measurement system 686. The control system 688 receives information from the measurement system 686 and controls the stage assemblies 682, 684 to precisely position the reticle 690 and the wafer 692. The control system 688 can include one or more processors and circuits.

A photolithography system (an exposure apparatus) according to the embodiments described herein can be built by assembling various subsystems, including each element listed in the appended claims, in such a manner that prescribed mechanical accuracy, electrical accuracy, and optical accuracy are maintained. In order to maintain the various accuracies, prior to and following assembly, every optical system is adjusted to achieve its optical accuracy. Similarly, every mechanical system and every electrical system are adjusted to achieve their respective mechanical and electrical accuracies. The process of assembling each subsystem into a photolithography system includes mechanical interfaces, electrical circuit wiring connections and air pressure plumbing connections between each subsystem. Needless to say, there is also a process where each subsystem is assembled prior to assembling a photolithography system from the various subsystems. Once a photolithography system is assembled using the various subsystems, a total adjustment is performed to make sure that accuracy is maintained in the complete photolithography system. Additionally, it is desirable to manufacture an exposure system in a clean room where the temperature and cleanliness are controlled.

Figure 7A:
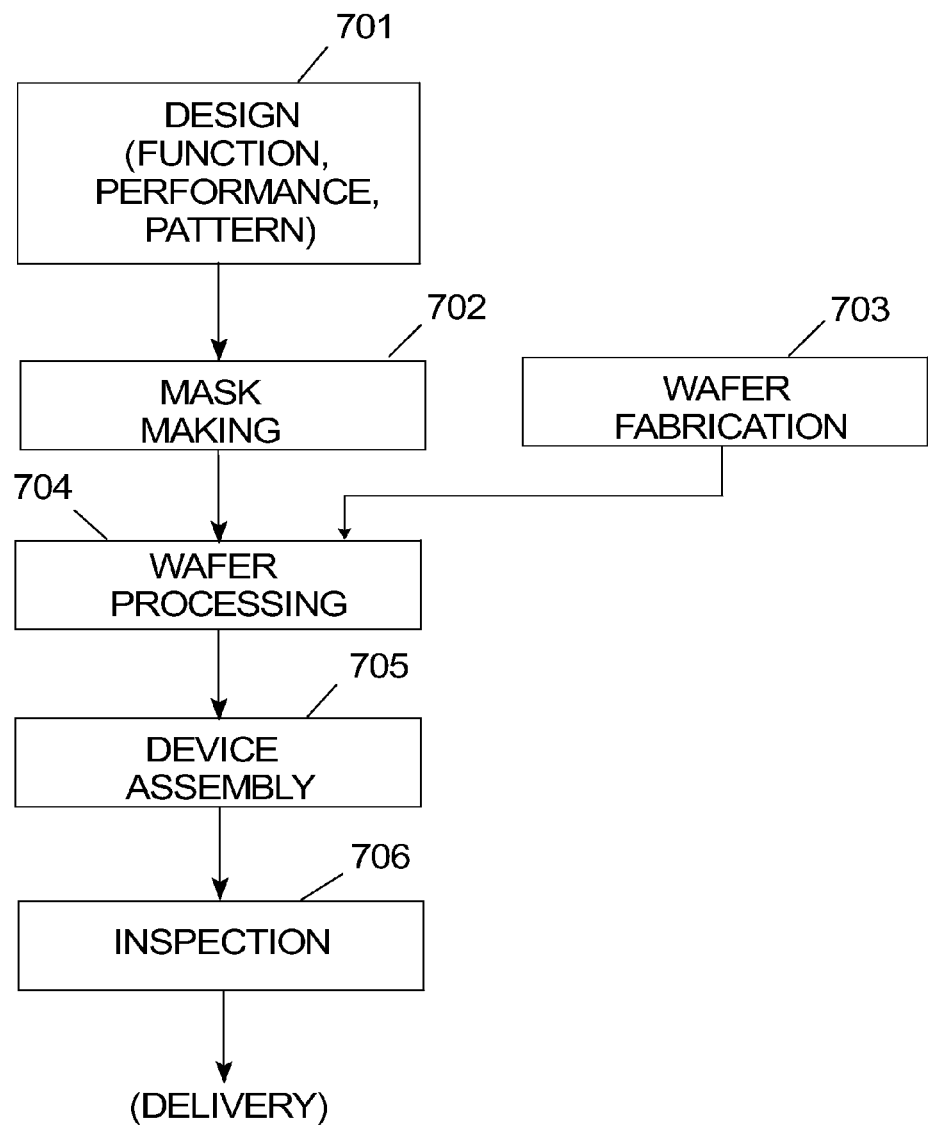
FIG. 7A is a flow chart that outlines a process for manufacturing a device in accordance with the present invention.

Further, semiconductor devices can be fabricated using the above described systems, by the process shown generally in FIG. 7A. In step 701, the device's function and performance characteristics are designed. Next, in step 702, a mask (reticle) having a pattern is designed according to the previous designing step, and in a parallel step 703, a wafer is made from a silicon material. In step 704, the mask pattern designed in step 702 is exposed onto the wafer from step 703 by a photolithography system described hereinabove in accordance with the present invention. In step 705, the semiconductor device is assembled (including the dicing process, bonding process and packaging process). Finally, the device is then inspected in step 706.

Figure 7B:
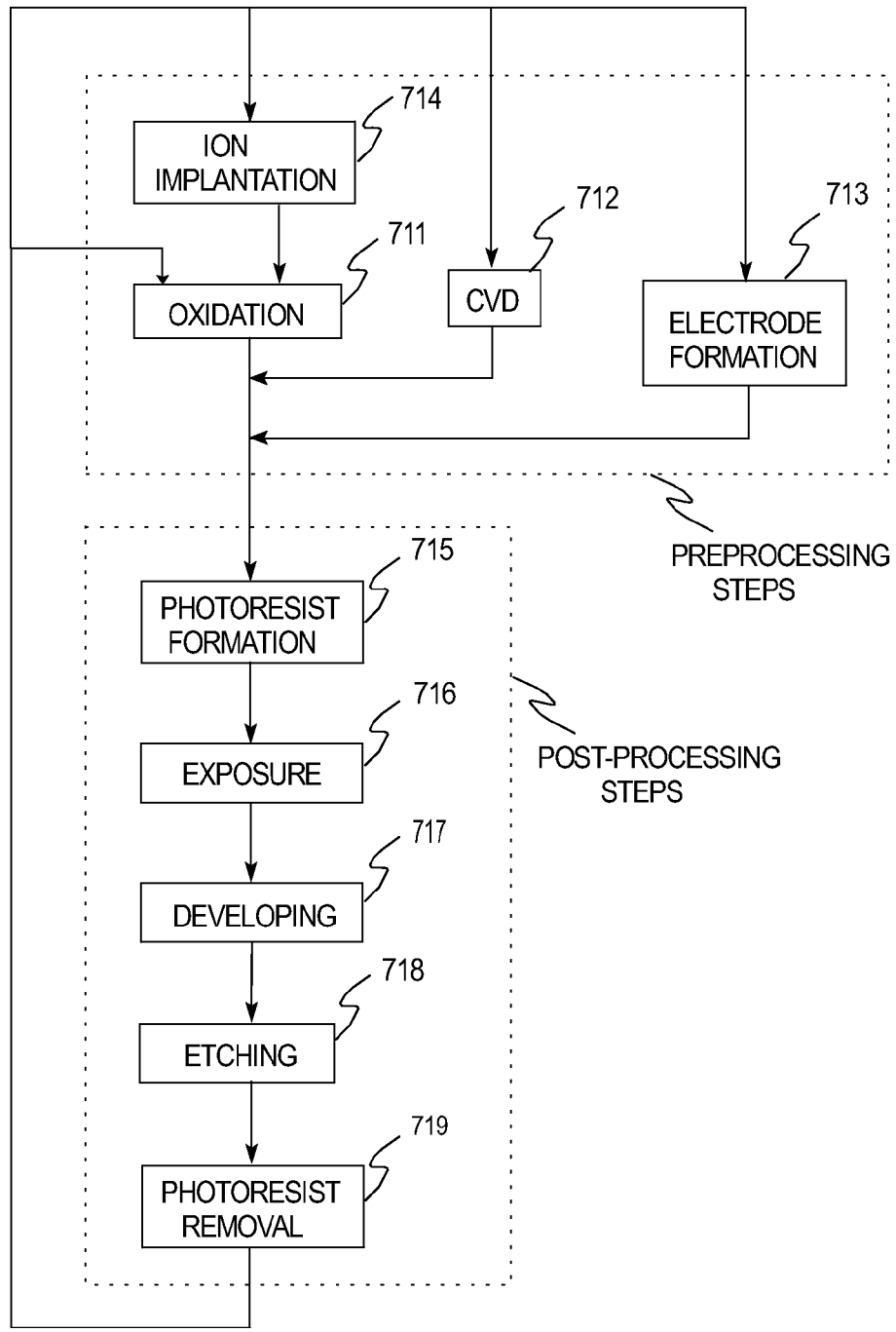
FIG. 7B is a flow chart that outlines device processing in more detail.

FIG. 7B illustrates a detailed flowchart example of the above-mentioned step 704 in the case of fabricating semiconductor devices. In FIG. 7B, in step 711 (oxidation step), the wafer surface is oxidized. In step 712 (CVD step), an insulation film is formed on the wafer surface. In step 713 (electrode formation step), electrodes are formed on the wafer by vapor deposition. In step 714 (ion implantation step), ions are implanted in the wafer. The above mentioned steps 711-714 form the preprocessing steps for wafers during wafer processing, and selection is made at each step according to processing requirements.

At each stage of wafer processing, when the above-mentioned preprocessing steps have been completed, the following post-processing steps are implemented. During post-processing, first, in step 715 (photoresist formation step), photoresist is applied to a wafer. Next, in step 716 (exposure step), the above-mentioned exposure device is used to transfer the circuit pattern of a mask (reticle) to a wafer. Then in step 717 (developing step), the exposed wafer is developed, and in step 718 (etching step), parts other than residual photoresist (exposed material surface) are removed by etching. In step 719 (photoresist removal step), unnecessary photoresist remaining after etching is removed.

Multiple circuit patterns are formed by repetition of these preprocessing and post-processing steps.

While a number of exemplary aspects and embodiments of a beam adjuster assembly 14 have been discussed above, those of skill in the art will recognize certain modifications, permutations, additions and sub-combinations thereof. It is therefore intended that the following appended claims and claims hereafter introduced are interpreted to include all such modifications, permutations, additions and sub-combinations as are within their true spirit and scope.

What is claimed is:

1. A beam adjuster assembly for a measurement system of a lithography system for measuring displacement of a stage which retains a substrate for a lithography process of the lithography system, the beam adjuster assembly receiving an input beam and providing a first output beam and a spaced apart second output beam, the beam adjuster assembly comprising:
    a first frequency adjuster that receives the input beam, the first frequency adjuster transmitting a first portion of the input beam without any change in frequency to provide the first output beam having a first output frequency, and the first frequency adjuster adjusting a frequency of a second portion of the input beam to provide a first adjusted beam; and
    a second frequency adjuster that receives the first adjusted beam, the second frequency adjuster adjusting the frequency of at least a portion of the first adjusted beam to provide the second output beam having a second output frequency that is different than the first output frequency.

2. The beam adjuster assembly of claim 1 wherein the first output beam has a first power and the second output beam has a second power that is substantially equal to the first power.

3. The beam adjuster assembly of claim 1 wherein the second output frequency is different than the first output frequency by between 10 MHz and 30 MHz.

4. The beam adjuster assembly of claim 3 wherein the second output frequency is different than the first output frequency by 20 MHz.

5. The beam adjuster assembly of claim 1 wherein at least one of the first frequency adjuster and the second frequency adjuster is an acousto-optic frequency modulator.

6. The beam adjuster assembly of claim 1 wherein each of the first frequency adjuster and the second frequency adjuster is an acousto-optic frequency modulator.

7. The beam adjuster assembly of claim 1 wherein the first adjusted beam has a first adjusted frequency, wherein the first adjusted frequency is different than the first output frequency by between 60 and 250 MHz, and wherein the second output frequency is different than the first adjusted frequency by between 60 and 250 MHz.

8. The beam adjuster assembly of claim 7 wherein the first frequency adjuster shifts an input frequency of the input beam in a first shift direction to provide the first adjusted beam, and wherein the second frequency adjuster shifts the first adjusted frequency of the first adjusted beam in a second shift direction to provide the second output beam, the second shift direction being different from the first shift direction.

9. The beam adjuster assembly of claim 8 wherein the first shift direction includes one of an upshift and a downshift from the first input frequency to the first adjusted frequency, and wherein the second shift direction includes the other of an upshift and a downshift from the first adjusted frequency to the second output frequency.

10. A light source assembly comprising a beam source that provides an input beam, and the beam adjuster assembly of claim 1 that receives the input beam and provides the first output beam and the spaced apart second output beam.

11. A measurement system comprising: the light source assembly of claim 10, and a system head that receives the first output beam and the second output beam provided by the light source assembly, the system head directing at least one of the output beams at the stage assembly.

12. An exposure apparatus comprising a stage assembly that retains a device, and the measurement system of claim 11 that measures the displacement of the stage assembly relative to the reference.

13. A method for providing a first output beam and a spaced apart second output beam for use in a measurement system for measuring displacement of a stage which retains a substrate to be processed by a lithography system, the method comprising the steps of:
    receiving an input beam with a first frequency adjuster;
    transmitting a first portion of the input beam with the first frequency adjuster to provide the first output beam having a first output frequency;
    adjusting a second portion of the input beam with the first frequency adjuster to provide a first adjusted beam;
    receiving the first adjusted beam with a second frequency adjuster; and
    adjusting at least a portion of the first adjusted beam with the second frequency adjuster to provide the second output beam having a second output frequency that is different than the first output frequency.

14. The method of claim 13 wherein the step of transmitting includes the first output beam having a first power, and wherein the step of adjusting at least a portion of the first adjusted beam includes the second output beam having a second power that is substantially equal to the first power.

15. The method of claim 13 wherein the second output frequency is different than the first output frequency by between 10 MHz and 30 MHz. 15.

16. The method of claim 13 wherein at least one of the first frequency adjuster and the second frequency adjuster is an acousto-optic frequency modulator.

17. The method of claim 13 wherein the step of adjusting a second portion of the input beam includes the first adjusted beam having a first adjusted frequency that is different than the first output frequency by between 60 and 250 MHz, and wherein the second output frequency is different than the first adjusted frequency by between 60 and 250 MHz.

18. The method of claim 17 wherein the step of adjusting a second portion of the input beam includes the first frequency adjuster shifting an input frequency of the input beam in a first shift direction to provide the first adjusted beam, and wherein the step of adjusting at least a portion of the first adjusted beam includes the second frequency adjuster shifting the first adjusted frequency of the first adjusted beam in a second shift direction to provide the second output beam, the second shift direction being different from the first shift direction.

19. The method of claim 18 wherein the step of adjusting a second portion of the input beam includes the first shift direction including one of an upshift and a downshift from the first input frequency to the first adjusted frequency, and wherein the step of adjusting at least a portion of the first adjusted beam includes the second shift direction including the other of an upshift and a downshift from the first adjusted frequency to the second output frequency.

20. A lithography system comprising:
a stage assembly that retains a device; and
a measurement system that measures the displacement of the stage assembly relative to a reference, the measurement system comprising:
(A) a light source assembly including (i) a beam source that provides an input beam, and (ii) a beam adjuster assembly that receives the input beam and provides a first output beam and a spaced apart second output beam, the beam adjuster assembly comprising:
(a) a first frequency adjuster that receives the input beam, the first frequency adjuster transmitting a first portion of the input beam without any change in frequency to provide the first output beam having a first output frequency, and the first frequency adjuster adjusting a frequency of a second portion of the input beam in a first shift direction to provide a first adjusted beam having a first adjusted frequency that is different than the first output frequency by between 60 and 250 MHz; and (b) a second frequency adjuster that receives the first adjusted beam, the second frequency adjuster adjusting the frequency of at least a portion of the first adjusted beam in a second shift direction that is different from the first shift direction to provide the second output beam having a second output frequency that is different than the first adjusted frequency by between 60 and 250 MHz; and wherein the second output frequency is different than the first output frequency by between 10 MHz and 30 MHz;
(B) an encoder grating plate that is secured to the stage assembly; and
(C) a system head that receives the first output beam and the second output beam provided by the light source assembly, the system head directing one of the output beams at the encoder grating plate, the one of the output beams being reflected off the encoder grating plate back to the system head.

21. The lithography system of claim 20 wherein the system head directs the one of the output beams at the encoder grating plate along a first beam path, and wherein the one of the output beams is reflected off the encoder grating plate back to the system head along a second beam path that is different than the first beam path.

22. The lithography system of claim 20 wherein the first shift direction includes one of an upshift and a downshift from the first input frequency to the first adjusted frequency, and wherein the second shift direction includes the other of an upshift and a downshift from the first adjusted frequency to the second output frequency.

23. The lithography system of claim 20 wherein the first frequency adjuster adjusts the frequency of the second portion of the input beam in the first shift direction to provide the first adjusted beam having the first adjusted frequency that is different than the first output frequency by 150 MHz; and wherein the second frequency adjuster adjusts the frequency of the at least a portion of the first adjusted beam in the second shift direction to provide the second output beam having the second output frequency that is different than the first adjusted frequency by 130 MHz; and wherein the second output frequency is different than the first output frequency by 20 MHz.

24. The lithography system of claim 20 wherein the first frequency adjuster adjusts the frequency of the second portion of the input beam in the first shift direction to provide the first adjusted beam having the first adjusted frequency that is different than the first output frequency by 130 MHz; and wherein the second frequency adjuster adjusts the frequency of the at least a portion of the first adjusted beam in the second shift direction to provide the second output beam having the second output frequency that is different than the first adjusted frequency by 150 MHz; and wherein the second output frequency is different than the first output frequency by 20 MHz.

25. The beam adjuster assembly of claim 20 wherein at least one of the first frequency adjuster and the second frequency adjuster is an acousto-optic frequency modulator.

26. The beam adjuster assembly of claim 20 wherein each of the first frequency adjuster and the second frequency adjuster is an acousto-optic frequency modulator.

27. The beam adjuster assembly of claim 20 wherein the first frequency adjuster has a first diffraction efficiency and a first transmission efficiency so that the first output beam has a first power; wherein the second frequency adjuster has a second diffraction efficiency and a second transmission efficiency so that the second output beam has a second power; and wherein the second power is equal to the first power.

28. A method comprising:
retaining a device with a stage assembly; and
measuring the displacement of the stage assembly relative to a reference with a measurement system, the measuring the displacement of the stage assembly comprising:
providing an input beam with a beam source;
receiving the input beam with a beam adjuster assembly to provide a first output beam and a spaced apart second output beam, the beam adjuster assembly comprising:
(a) a first frequency adjuster that receives the input beam, the first frequency adjuster transmitting a first portion of the input beam without any change in frequency to provide the first output beam having a first output frequency, and the first frequency adjuster adjusting a frequency of a second portion of the input beam in a first shift direction to provide a first adjusted beam having a first adjusted frequency that is different than the first output frequency by between 60 and 250 MHz; and (b) a second frequency adjuster that receives the first adjusted beam, the second frequency adjuster adjusting the frequency of at least a portion of the first adjusted beam in a second shift direction that is different from the first shift direction to provide the second output beam having a second output frequency that is different than the first adjusted frequency by between 60 and 250 MHz; and wherein the second output frequency is different than the first output frequency by between 10 MHz and 30 MHz; and receiving the first output beam and the second output beam with a system head, the system head directing one of the output beams at an encoder grating plate that is secured to the stage assembly; the one of the output beams being reflected off the encoder grating plate back to the system head.

29. The method of claim 28 wherein receiving the first output beam and the second output beam with the system head includes the system head directing the one of the output beams at the encoder grating plate along a first beam path, and wherein the one of the output beams is reflected off the encoder grating plate back to the system head along a second beam path that is different than the first beam path.

30. The method of claim 28 wherein receiving the input beam with the beam adjuster assembly includes the first shift direction including one of an upshift and a downshift from the first input frequency to the first adjusted frequency, and the second shift direction including the other of an upshift and a downshift from the first adjusted frequency to the second output frequency.

31. The method of claim 28 wherein receiving the input beam with the beam adjuster assembly includes the first frequency adjuster adjusting the frequency of the second portion of the input beam in the first shift direction to provide the first adjusted beam having the first adjusted frequency that is different than the first output frequency by 150 MHz; and the second frequency adjuster adjusting the frequency of the at least a portion of the first adjusted beam in the second shift direction to provide the second output beam having the second output frequency that is different than the first adjusted frequency by 130 MHz; and wherein the second output frequency is different than the first output frequency by 20 MHz.

32. The method of claim 28 wherein receiving the input beam with the beam adjuster assembly includes the first frequency adjuster adjusting the frequency of the second portion of the input beam in the first shift direction to provide the first adjusted beam having the first adjusted frequency that is different than the first output frequency by 130 MHz; and the second frequency adjuster adjusting the frequency of the at least a portion of the first adjusted beam in the second shift direction to provide the second output beam having the second output frequency that is different than the first adjusted frequency by 150 MHz; and wherein the second output frequency is different than the first output frequency by 20 MHz.

33. The method of claim 28 wherein receiving the input beam with the beam adjuster assembly includes at least one of the first frequency adjuster and the second frequency adjuster being an acousto-optic frequency modulator.

34. The method of claim 28 wherein receiving the input beam with the beam adjuster assembly includes each of the first frequency adjuster and the second frequency adjuster being an acousto-optic frequency modulator.

35. The method of claim 28 wherein receiving the input beam with the beam adjuster assembly includes the first frequency adjuster having a first diffraction efficiency and a first transmission efficiency so that the first output beam has a first power; and the second frequency adjuster having a second diffraction efficiency and a second transmission efficiency so that the second output beam has a second power;

and wherein the second power is equal to the first power.

\* \* \* \* \*